US009947525B2

(12) United States Patent
Biel et al.

(10) Patent No.: US 9,947,525 B2
(45) Date of Patent: Apr. 17, 2018

(54) TIME INTERVAL MEASUREMENT

(71) Applicant: Thermo Fisher Scientific (Bremen) GmbH, Bremen (DE)

(72) Inventors: Matthias Biel, Bremen (DE); Richard Heming, Bremen (DE); Anastassios Giannakopulos, Bremen (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 0 days.

(21) Appl. No.: 15/151,430

(22) Filed: May 10, 2016

(65) Prior Publication Data

US 2016/0336162 A1 Nov. 17, 2016

(30) Foreign Application Priority Data

May 11, 2015 (GB) .................................. 1507989.0

(51) Int. Cl.
*H01J 49/40* (2006.01)
*H03M 1/12* (2006.01)
*G04F 10/00* (2006.01)

(52) U.S. Cl.
CPC .............. *H01J 49/40* (2013.01); *G04F 10/00* (2013.01)

(58) Field of Classification Search
CPC ........ H01J 49/40; H01J 49/00; H01J 49/0009; H01J 49/0027; H01J 49/004; H01J 49/0036; H01J 49/36; G04F 10/00; H03M 1/124
USPC ................................ 250/281, 282, 283, 287
See application file for complete search history.

(56) References Cited

U.S. PATENT DOCUMENTS

| | | | | |
|---|---|---|---|---|
| 6,031,227 A * | 2/2000 | Becker | H01J 49/025 250/287 |
| 2004/0098178 A1* | 5/2004 | Brady | B64G 1/288 701/4 |
| 2005/0052952 A1 | 3/2005 | Panek | |

FOREIGN PATENT DOCUMENTS

| | | |
|---|---|---|
| EP | 0141122 A1 | 5/1985 |
| WO | 2011/048060 A2 | 4/2011 |

OTHER PUBLICATIONS

Kalisz, "Review of methods for time interval measurements with picoseconds resolution," Metrologia, 2004, vol. 41, pp. 17-32.

* cited by examiner

*Primary Examiner* — Nicole Ippolito
(74) *Attorney, Agent, or Firm* — David A. Schell

(57) ABSTRACT

A technique for time interval measurement is provided. First and second signal components are received, sampled and digitized. The first signal component is derived from a trigger signal that causes or indicates generation 5 of the second signal component. A time interval between the first and second signal components is determined based on a reference time defined by the sampled and digitized first signal component and based on a reference time defined by the sampled and digitized second signal component.

11 Claims, 6 Drawing Sheets

TIME INTERVAL MEASUREMENT

TECHNICAL FIELD OF THE INVENTION

The invention concerns a device or a method for time interval measurement, especially for measuring time-of-flight for mass spectrometry purposes.

BACKGROUND TO THE INVENTION

Time interval measurement is used in a wide range of applications, especially for scientific measurements where high accuracy and precision are desired. Digital time measurement is commonly used, by means of a Time-to-Digital Converter (TDC), in which a trigger signal is used to start a digital timer and the time being measured is determined using a response signal which is digitally sampled. The accuracy is therefore limited by the sampling rate of the Analogue to Digital Convertor (ADC). It is known to use interpolation methods to achieve resolutions better than the sampling rate. Examples of such methods are presented at various publications, for instance "Review of methods for time interval measurements with picoseconds resolution", Jozef Kalisz, Metrologia 41 (2004) 17-32.

One application of such time interval measurement is in Time-of-Flight (TOF) mass spectrometry. The use of time interval measurement in such a mass spectrometer is detailed in WO-2011/048060. Here, the process of acquiring pulses which correspond with ions of different mass-to-charge (m/z) ratios is initiated either by:

a) the signal of an electronic component (such as a photodiode) produced as a response of a laser pulse, which is responsible for the desorption or ionisation of ions from a surface or for ionisation of gasses; or b) electronic pulses which signify the extraction of ions from the ion source (such a source can be orthogonal extracting electrodes or an RF trap).

An existing time interval measurement uses two ADCs, each running with a 1 GHz clock and therefore providing samples every 1 ns. The ADC interface is configured to communicate with two parallel data buses, each running at 250 MHz with Double Data Rate (DDR) and therefore provides two samples every 2 ns. An FPGA section is connected to the ADC interface and thereby simultaneously captures 4 ADC samples every clock cycle (4 ns period). To build a correlation within the 4 GHz time domain (required for 250 ps resolution), an interpolation technique is implemented. Referring to FIG. 1, there is shown a schematic timing diagram to detail how such interpolation within a clock cycle can be implemented. The "trigger IN" event is captured and delayed by 250 ps, 500 ps and 750 ps inside the FPGA. The input signal (such as a mass spectrum) is then matched to the four delayed "trigger IN" signals. This allows a timing resolution of 250 ps to be obtained.

To demonstrate the performance of such a digitiser at 1 ns sampling rate and the effect of interpolation, experiments were carried out. These will now be described. A Gaussian pulse was produced by a test device and subsequently fed to a first channel of a digitiser. The same test device produced a trigger pulse to cause generation of the Gaussian pulse, with the ability to delay the trigger pulse by multiples of 11 ps. The timing of the Gaussian pulse was measured 100 times for each delay of the trigger pulse.

Referring to FIG. 2, there is shown a plot of the average centroid time and the standard deviation of the centroid time for the Gaussian pulse as the delay is varied. The trigger pulse was delayed between 0 and 5000 ps. On the acquisition side, the trigger was recorded with a resolution of 1000 ps (which was the native sample rate of the ADC). The standard deviation of the centroid time is generally low. At five significant positions though, the standard deviation peaks at approximately (50% of the sample rate). The peaks have a width of about 120 ps. These large standard deviation peaks appear inevitable and can be related to the sample rate. At these positions, a transition between two samples occurs, each with a width of 1000 ps. The overall standard deviation is 290.54 ps.

To improve the detection accuracy for the trigger, interpolation circuitry was implemented. This maps the trigger to one of four 250 ps wide bins, as explained above with reference to FIG. 1. Referring to FIG. 3, there is shown a plot of the average centroid time and the standard deviation of the centroid time for the Gaussian pulse as the delay is varied for the interpolation case. In comparison with FIG. 2, it can be seen that the average centroid number of steps is increased (by a factor of 4) and the step size and step width is reduced. In practice, it is not possible to calibrate these bins to exactly 250 ps width. Therefore, the steps in the average centroid plot of FIG. 3 do not have the same width. The number of peaks in the centroid standard deviation has correspondingly increased, but the height of these peaks is lower (around 125 ps). The width of these peaks is about 100 ps and they are around 250 ps apart. The overall standard deviation for this experiment is 82.34 ps, which is only about a quarter of the overall standard deviation of the same experiment with 1000 ps trigger resolution.

This means that a resolution of approximately 250 ps is indeed possible using interpolation. However, it can be seen that calibration of the high resolution trigger is not perfect, due to hardware limitations. Higher resolution measurement without such difficulties is a continuing challenge.

SUMMARY OF THE INVENTION

Against this background, a device for time interval measurement is provided in accordance with claim 1. A corresponding method for time interval measurement in line with claim 11 is further provided. Also considered is an ion detection system for a time-of-flight mass spectrometer as defined by claim 9. Other optional and advantageous features are defined in the claims.

Both a trigger signal component and a timing signal component are fed to an Analogue to Digital Convertor (ADC). The trigger signal component is or is derived from a trigger signal that causes or indicates generation of the timing signal component. The ADC samples and/or digitises the trigger signal component and timing signal component. A time interval between the first and second signal components is determined using a reference time defined by the sampled and digitised trigger signal component and a reference time defined by the sampled and digitised timing signal component.

Sampling the trigger signal component results in a reference time that, on average, varies continuously with the timing of the trigger signal. This is unlike the timing signal component, for which the reference time derived from it changes step-wise as the timing of the timing signal component varies. In particular, one or both of the reference times are typically determined using a statistical parameter, such as a centroid (preferably determined using a half-integral centroider), of the sampled signal components. Interpolation can optionally be used to determine one or both of the reference times. A plurality of measurements (each having respective trigger and timing signal components) may be taken to plurality a plurality of time internals and an average time interval may be determined.

Preferably, the trigger and timing signal components are combined into a single signal. This may be provided to one channel of the ADC. Optionally, the timing signal component alone may provide a signal input to a second channel of the ADC. The trigger signal component may be a delayed version of the trigger signal, which may allow its detection more readily.

BRIEF DESCRIPTION OF THE DRAWINGS

The invention may be put into practice in a number of ways, and preferred embodiments will now be described by way of example only and with reference to the accompanying drawings, in which.

DETAILED DESCRIPTION OF PREFERRED EMBODIMENTS

Essentially, the invention samples the trigger signal (or a delayed version of the trigger signal, to avoid measurement difficulties) and uses this to determine a first reference time. This first reference time can then be compared with a reference time derived from the sampled waveform to be recorded. Advantageously, the trigger signal (which may be termed a "trigger IN" pulse) is mixed with the waveform to be recorded. Especially in time of flight mass spectrometry applications, the two signals do not overlap. The recorded analyte signal arrives many microseconds after the trigger pulse, which is only a few tens of nanoseconds in length.

In general terms, this may be understood as a device or method for time interval measurement. First and second signal components are received (at an input), the first signal component being derived from a trigger signal that causes or indicates generation of the second signal component. In this way, the first or trigger signal component can indicate generation of the second signal component. As examples, the trigger signal may trigger a laser pulse or electronic pulse that generates a pulse of ions that is detected by an ion detector, preferably after separating the ions according to time of flight. In particular, the trigger signal may be derived from a photodiode illuminated by the laser pulse. The trigger that starts the laser may not be accurate enough for TOF applications. The second signal component may therefore be derived from the ion detector and may correspond to a peak in a mass spectrum of the ions.

An Analogue to Digital Convertor, ADC, samples and digitises the received first and second signal components. Then, a time interval is determined between the first and second signal components (by a processor), based on a reference time defined by the sampled and digitised first signal component and based on a reference time defined by the sampled and digitised second signal component. A delay element may be arranged to receive the trigger signal and to provide a delayed version of the trigger signal to the input, as the trigger signal component. The delay element may be a transmission line, such as a coaxial cable. A signal combiner is preferably arranged to combine the signal components into a single signal.

Figure 4:
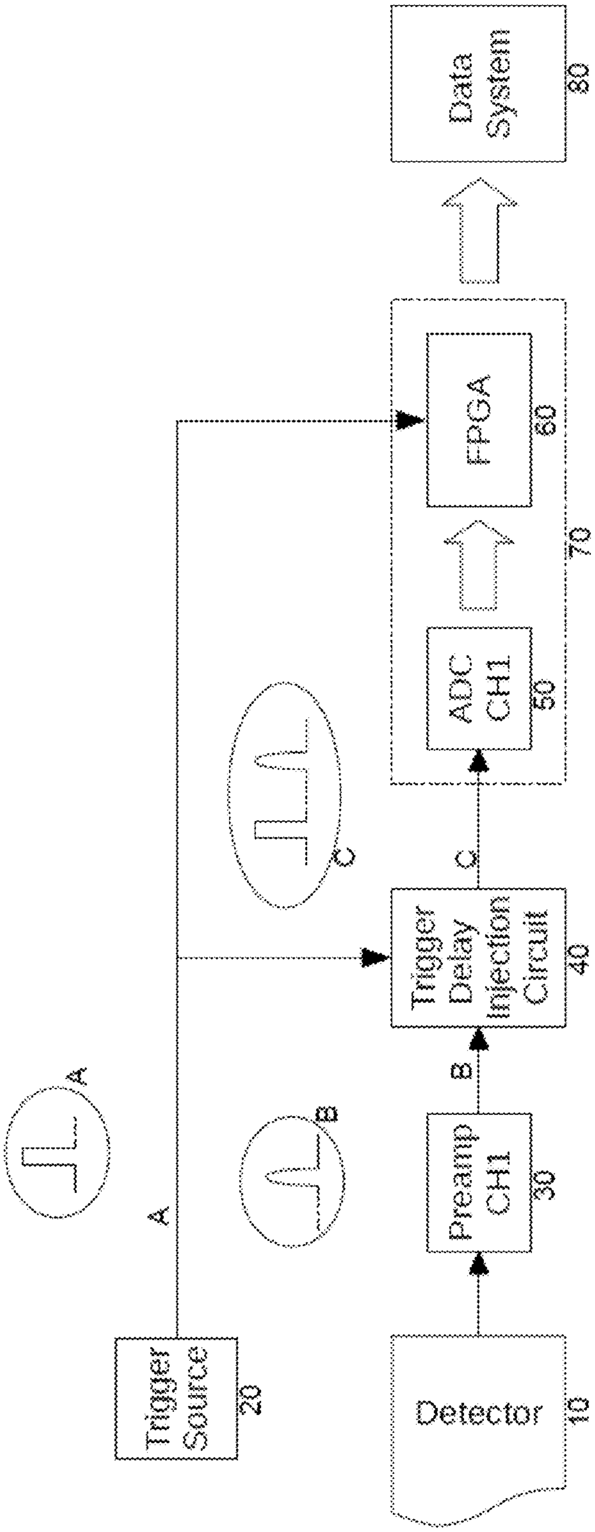
FIG. 4 illustrates a first embodiment of a detection system using time measurement in accordance with the invention.

Two possible embodiments in accordance with this general technique will now be described. With reference to FIG. 4, there is illustrated a first embodiment of a detection system using time measurement in accordance with the invention. This comprises: a detector 10; a trigger source 20; a preamplifier 30; a trigger delay injection circuit 40; an ADC 50; a Field-Programmable Gate Array (FPGA) 60; and a data analysis system 80. The ADC 50 and FPGA 60 may together be considered a time measurement device 70.

The trigger source 20 generates a trigger signal A, which results in detector 10 recording a detected pulse signal B. Trigger signal A is received at the trigger delay injection circuit 40, where it is delayed and combined with the detected pulse signal B to provide a combined signal C. The combined signal C is digitised at the ADC 50 and processed by the FPGA 60 determine a time interval between pulses A and B. The trigger signal A is further supplied to the FPGA 60 to start the timing process.

Figure 5:
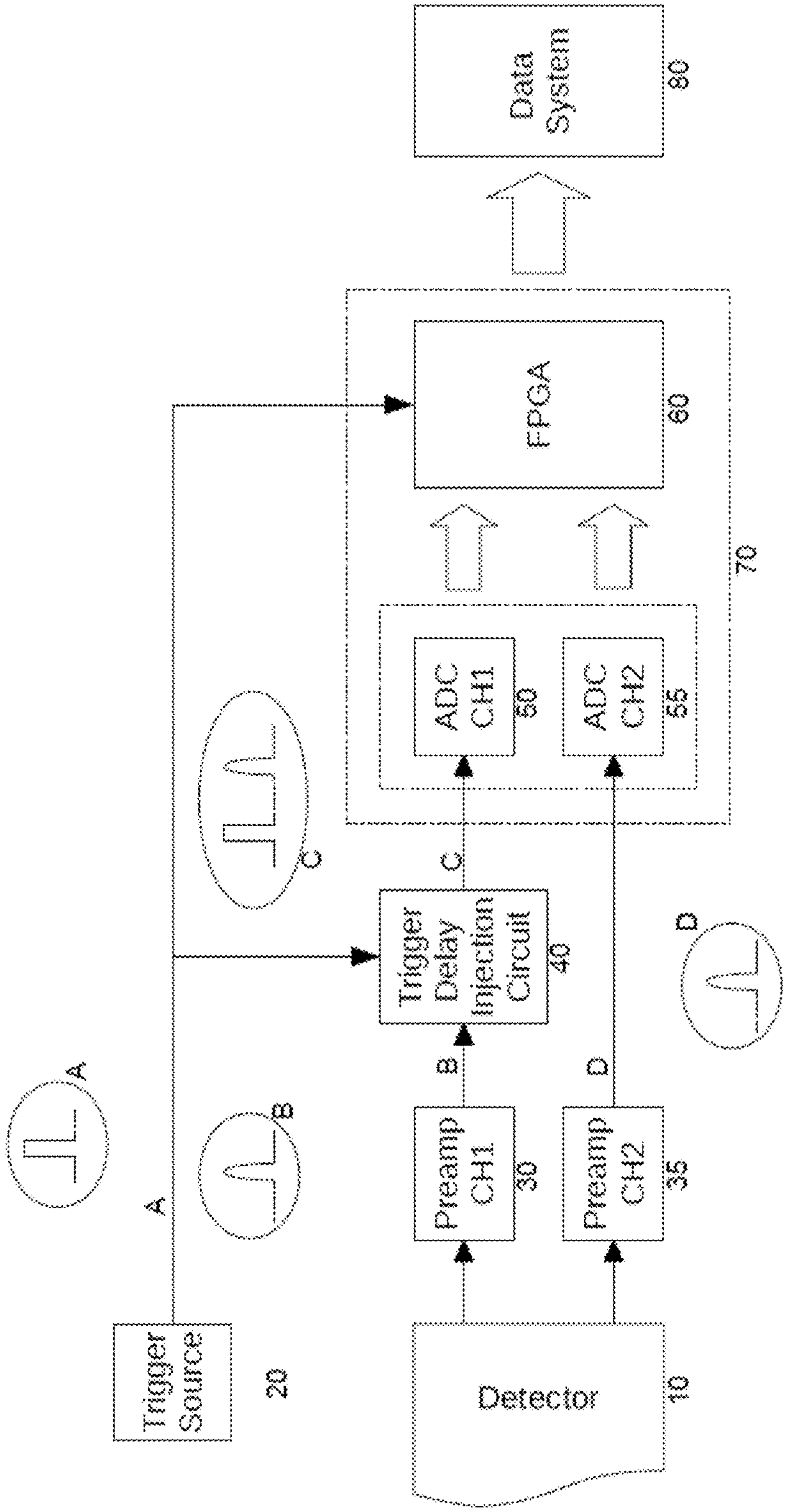
FIG. 5 illustrates a second embodiment of a detection system using time measurement in accordance with the invention.

There is illustrated in FIG. 5, a second embodiment of a detection system using time measurement in accordance with the invention. This is similar to the embodiment of FIG. 4 in many respects and where the same features are used, identical reference signs have been employed. In addition to the features of FIG. 4, there is further provided a second preamplifier 35 and a second ADC 55. The trigger signal A is still mixed with the detected pulse signal B to provide a combined signal C, which is supplied as an input to the first ADC 50. Moreover, the detected pulse signal is amplified separately to provide a second detected pulse signal D, which is supplied to the second ADC 55. Normally high-speed ADCs are made as "true" dual devices and therefore the samples are totally aligned. Feeding the trigger into one channel will provide the same precision on the second channel. Again, the trigger signal A is also supplied to the FPGA 60 to start the timing process.

The invention may therefore generally be embodied in an ion detection system (particularly for a time-of-flight mass spectrometer) comprising: an ion detector; and a device for time interval measurement as described herein. The second signal component may be derived from the output of the ion detector. A time-of-flight mass spectrometer comprising such an ion detection system may further be provided. For example, the invention may be utilised in an ion detection system or data acquisition system for a time-of-flight mass spectrometer as described in WO-2011/048060 or WO-2012/080443.

Figure 6:
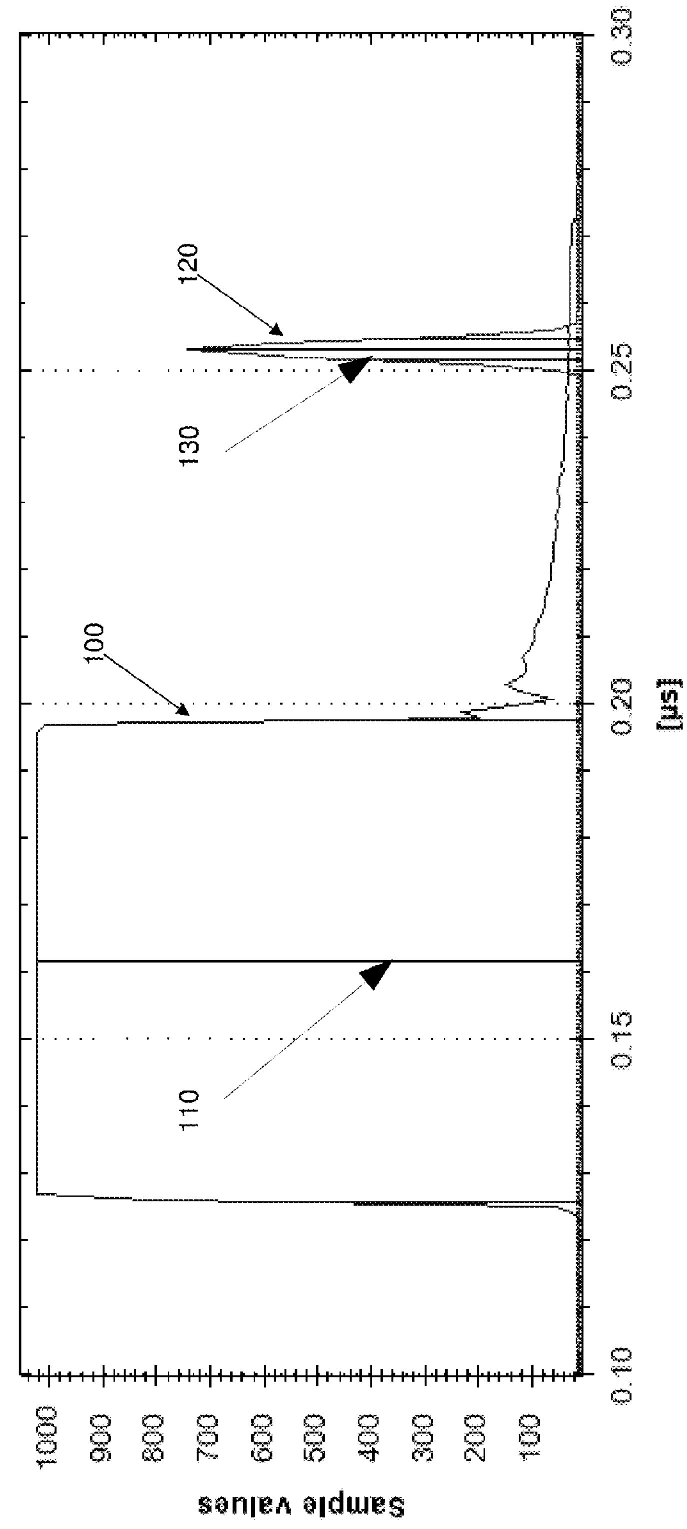
FIG. 6 depicts an example of a sampled trigger waveform and Gaussian pulse waveform from an experimental setup.

An experimental arrangement may be used as an example to show how the time interval determination works. Referring to FIG. 6, there is depicted an example of a sampled trigger waveform 100 and Gaussian pulse waveform 120 from such an experimental setup. This shows that the sampled trigger waveform 100 has a longer duration and faster rise time and fall time in comparison with the Gaussian pulse waveform 120. Also marked are the centroid 110 of the sampled trigger waveform 100 and the centroid 130 of the Gaussian pulse waveform 120. The centroids are determined by a half-integral centroider (which may be part of FPGA 60). A Photomultiplier tube (PMT) or secondary electron multiplier, as generally used in mass spectrometry, normally superimpose a distribution of electron pulses, which tends to result in a pulse of approximately Gaussian shape. Such pulses may have a longer fall (tail) than rise and therefore are unlikely to be perfectly symmetrical, but the approximation of a Gaussian pulse is a reasonable model. An alternative model may comprise two superimposed Gaussian pulses, for example with the same maximum and/or different standard deviations, or with different centroids. More details on the pulse shape may be found in "Improved Mass Accuracy in MALDI-TOF-MS Analysis", Martin Kempka, Royal Institute of Technology, Stockholm 2005.

In this experimental arrangement, a test board is programmed to generate a Gaussian pulse in response to a trigger signal, which may be generated by the same test board (in a loop-back mode) or by another test board. The output of the test board is connected to a first channel of a preamplifier. The trigger signal is not only connected to a trigger input of the test board, it is also connected to the second channel of the preamplifier. Since the acquisition hardware has a dead-time of about 50 ns, the trigger signal is delayed by at least 60 ns using a coaxial cable.

To adapt the voltage of the trigger signal to the input-range of the ADC, the signal was attenuated. Two different attenuators were tried: a 20 dB and a 10 dB attenuator. The 20 dB attenuator decreases the trigger signal so that it can be captured completely. When using the 10 dB attenuator, the upper part of the signal is cut off. However, the results were found to be better using the 10 dB attenuator, although the upper part of the signal is cut off. The higher accuracy appears to be achieved by the signal rising faster. The ADC has a 1000 ps resolution, in line with the example described with reference to FIG. 2. The difference between the centroids of the Gaussian pulse and the delayed trigger were then determined and averaged over 100 experiments.

It is also possible to specify an overall standard deviation of the signal by using a three-step approach. First, a linear regression of all acquired samples is computed (using the delay as independent and the sample as dependent variable). For each sample, the difference between the sample and the result of the linear regression is computed at the specific delay. Finally, the standard deviation and average are computed from the differences.

Figure 1:
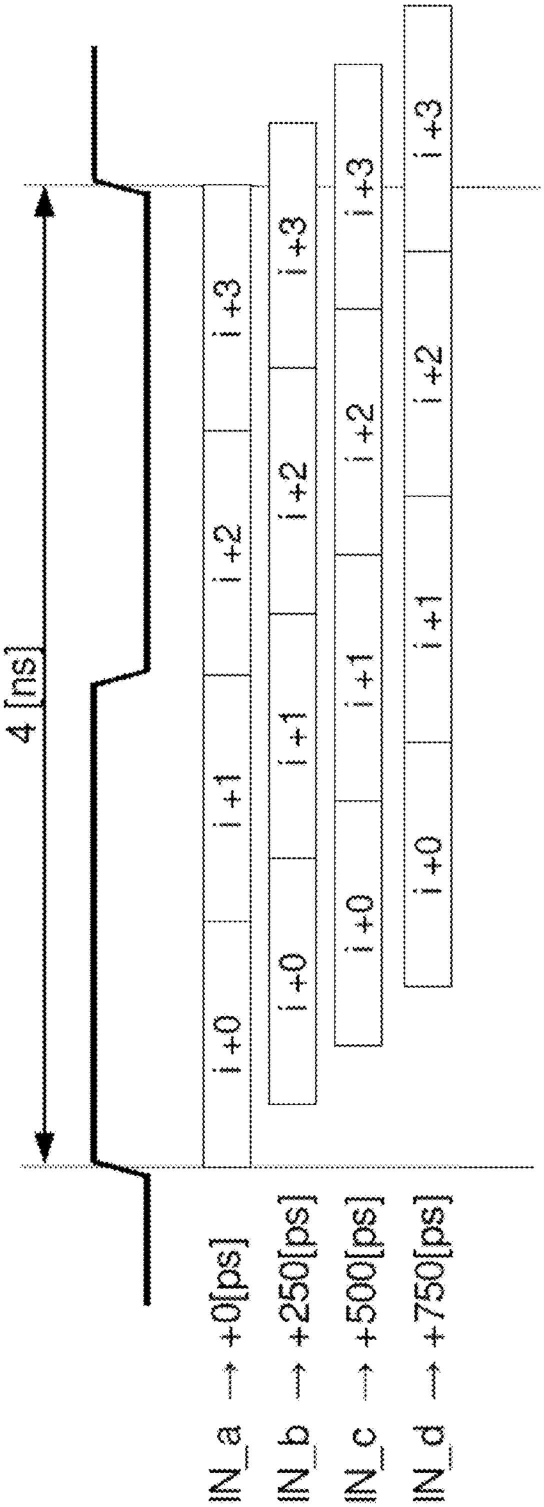
FIG. 1 shows a schematic timing diagram to detail how interpolation within a clock cycle can be implemented in a known configuration.
Figure 2:
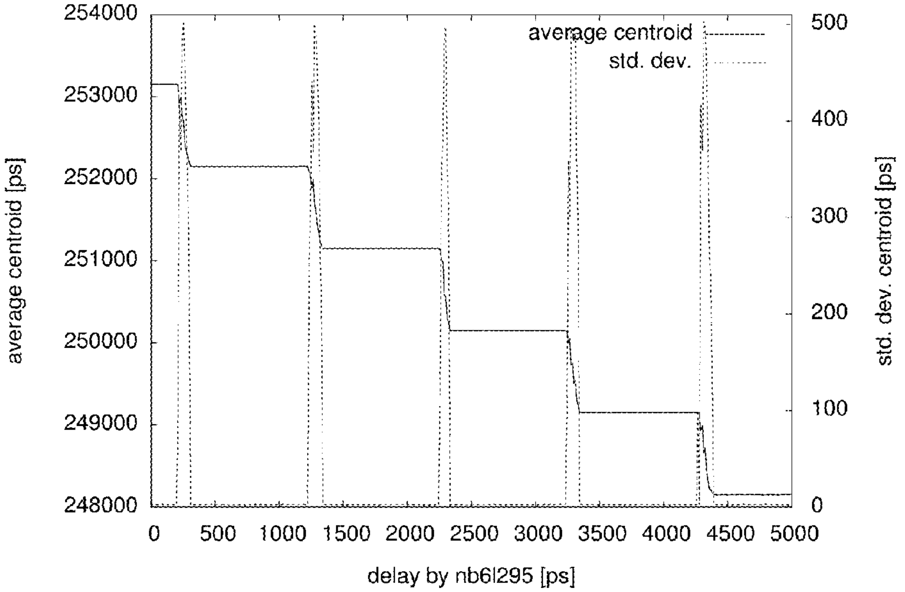
FIG. 2 shows a plot of the average centroid time and the standard deviation of the centroid time for a Gaussian pulse as a delay is varied in an experiment based on a known time measurement technique without interpolation.
Figure 3:
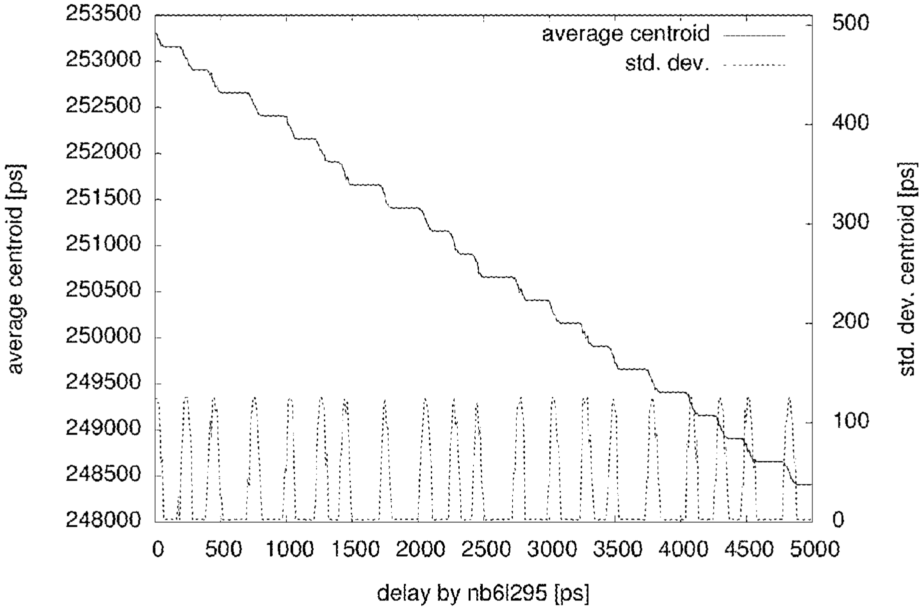
FIG. 3 shows a plot of the average centroid time and the standard deviation of the centroid time for a Gaussian pulse as a delay is varied in an experiment based on a known time measurement technique with interpolation.
Figure 7:
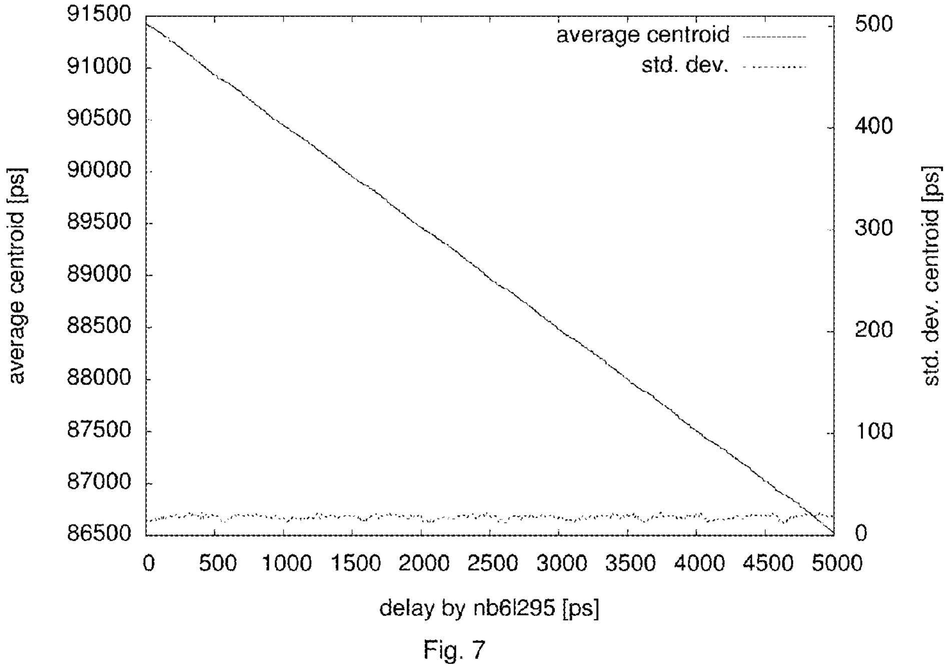
FIG. 7 shows a plot of the average centroid time and the standard deviation of the centroid time for a Gaussian pulse as a delay is varied in an experiment based on a time measurement technique in accordance with the invention without interpolation.

Referring now to FIG. 7, there is shown a plot of the average centroid time and the standard deviation of the centroid time for a Gaussian pulse as a delay is varied. It can be seen that the average varies with delay as a straight line. This is an indication of the quality of the system's time base. The peaks of the standard deviation as seen in FIGS. 2 and 3 have disappeared. The standard deviation lies between 10 ps and 20 ps (19.75 ps overall), which is better by a factor of four compared to what has been achieved using the interpolator as described above with reference to FIGS. 1 and 3.

Figure 8:
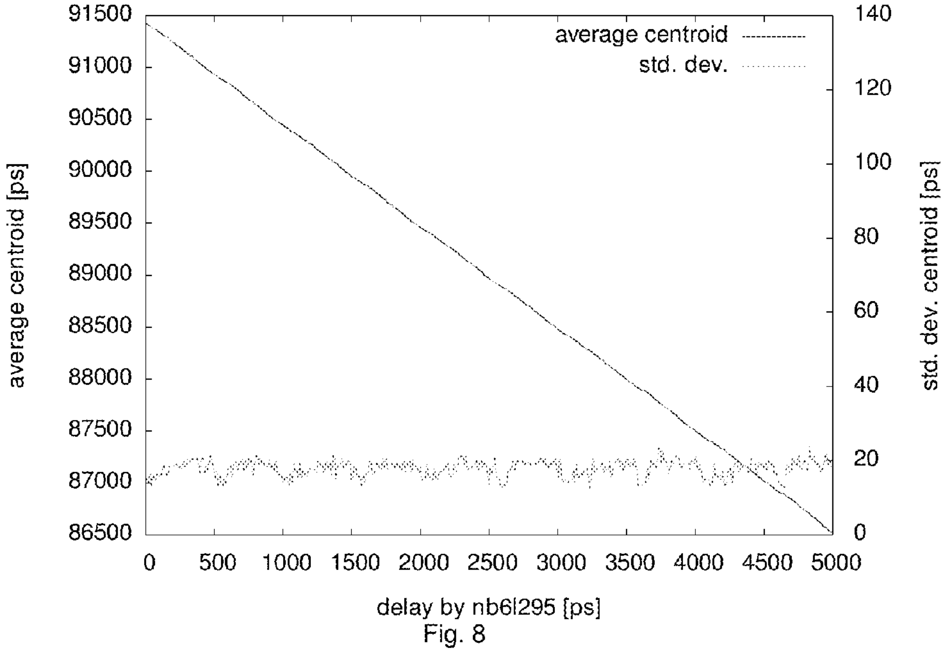
FIG. 8 shows a plot of the average centroid time and the standard deviation of the centroid time for a Gaussian pulse as a delay is varied in an experiment based on a time measurement technique in accordance with the invention with interpolation.

The additional effect of interpolation can also be considered. The same experiment was used with the addition of interpolation to increase the resolution to approximately 250 ps, in line with the examples of FIGS. 1 and 3. Referring to FIG. 8, there is shown a plot of the average centroid time and the standard deviation of the centroid time for a Gaussian pulse as a delay is varied when interpolation is used. It can be seen that the average centroid and the standard deviation of the centroid do not differ significantly from that shown in FIG. 7. Thus, the additional use of interpolation does not appear to improve the accuracy or resolution. In other words, interpolation may be used but it is not preferred.

In general terms, it may be considered that the trigger (first) signal component comprises a pulse. The rise time and/or fall time of the trigger signal pulse may be no greater than the resolution (sampling period) of the ADC (and/or than that of the second signal component) or no greater than half, two times or three times the resolution of the ADC. Generally, a rise and/or fall time of less than 1, 1, 2, 3, 4, 5 or 10 ns is used. The pulse may have a time duration of at least the resolution of the ADC (and/or than that of the second signal component) and preferably at least 2, 3, 4, 5, 10, 15 or 20 times the resolution of the ADC. A pulse of greater than 70, 80, 90, 100, 110, 120 or 130 ns is typical. A pulse of the second signal component having a full width at half maximum of no more than 3 ns appears to achieve best performance.

The trigger signal pulse and/or the second signal component typically have a non-ideal shape, such as Gaussian-based or triangular-based. In common time interval measurement systems using TDCs, fast rising signals are used to maintain low jitter and avoid degrading the precision. However, by determining a centroid of these pulses in order to determine a reference time, for example using statistical methods, the precision can be improved, even if the rise time of the pulses is not low. Rather, the improvement in precision might be possible by use of the statistical centroider, especially when a half integral centroider is used. It has been found that such a centroider may be used with a wide variety of pulse shapes and achieve improved performance.

The main advantage of the invention is superior accuracy, and that no special circuitry in hardware or firmware is required such as would be dictated by the use of an interpolator. The delay of the "trigger IN" signal can be achieved with the use of a long cable, as in the provided example. The trigger signal is fed into the channel which receives the waveform introducing an "internal calibrant", and all time is measured from this injected trigger.

Although specific embodiments have been described, the skilled person will appreciate that various modifications and alternations are possible. For example, alternatives to an FPGA may be used, which may be programmable or specifically-defined logic. Software can additionally or alternatively be used. Other configurations of the system are possible, in which components are combined or differently implemented. The use of one or more preamplifiers can be understood as optional. Although the use of the time interval measurement technique is especially considered for time-of-flight mass spectrometry detection, it may be employed in other systems, such as scientific instruments.

The trigger signal need not be the signal that causes generation of the signal being measured. For example, the trigger signal could be a signal that is measured or collected at the beginning of an ion generation process. In such cases, the trigger signal may simply indicate when the signal being measured is being or has been generated. In any event, the trigger signal is generated and advantageously arrives at the time interval measurement device earlier than the signal being measured.

Although a half-integral centroider is preferably used to compute the trigger signal centroid and the measured signal centroid, other types of centroider (or centroid algorithm) may be used. Preferably, the type of centroider used to determine the trigger signal centroid and the measured signal centroid are the same. This may advantageously result in cancelling of error introduced by the centroider, when the difference between the trigger signal centroid reference time and the measured signal centroid reference time is determined. Alternatively, different types of centroider may be used to determine the trigger signal centroid and the measured signal centroid. For example, a centroider that fits the error to a Gaussian model may be employed, especially for determining the measured signal centroid if that signal is Gaussian.

A coaxial cable has been used to delay the trigger signal in one embodiment. However, it will be recognised that any other form of transmission line may be used, particularly where the transmission line is configured not to exhibit a significant signal distortion.

The main application of the present invention, as described above, is in the field of scientific instruments, especially spectroscopy and spectrometry, such as mass analyzers and for an ion detection system in a TOF mass spectrometer in particular. However, an alternative application may be for a laser range finder. Other applications using time interval measurement are possible.

It will therefore be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

As used herein, including in the claims, unless the context indicates otherwise, singular forms of the terms herein are to be construed as including the plural form and vice versa. For instance, unless the context indicates otherwise, a singular reference herein including in the claims, such as "a" or "an" (such as an analogue to digital convertor) means "one or more" (for instance, one or more analogue to digital convertor). Throughout the description and claims of this disclosure, the words "comprise", "including", "having" and "contain" and variations of the words, for example "comprising" and "comprises" or similar, mean "including but not limited to", and are not intended to (and do not) exclude other components.

The use of any and all examples, or exemplary language ("for instance", "such as", "for example" and like language) provided herein, is intended merely to better illustrate the invention and does not indicate a limitation on the scope of the invention unless otherwise claimed. No language in the specification should be construed as indicating any non-claimed element as essential to the practice of the invention.

Any steps described in this specification may be performed in any order or simultaneously unless stated or the context requires otherwise.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A device for time interval measurement for a time-of-flight mass spectrometer, comprising:

an input, for receiving first and second signal components, the first signal component being derived from a trigger signal that causes or indicates generation of the second signal component;

an Analogue to Digital Convertor, ADC, arranged to sample and digitize the received first and second signal components; and a processor, configured to determine a time interval between the first and second signal components based on a reference time defined by the sampled and digitized first signal component and based on a reference time defined by the sampled and digitized second signal component.

2. The device of claim 1, wherein the processor is configured to determine the reference time defined by the sampled and digitized first signal component based on a statistical parameter of the sampled and digitized first signal component and to determine the reference time defined by the sampled and digitized second signal component based on a statistical parameter of the sampled and digitized second signal component.

3. The device of claim 2, wherein the statistical parameter of the sampled and digitized first signal component is a centroid of the sampled and digitized first signal component and wherein the statistical parameter of the sampled and digitized second signal component is a centroid of the sampled and digitized second signal component.

4. The device of claim 3, further comprising a half-integral centroider, configured to determine the centroid of the sampled and digitized first signal component.

5. The device of claim 1, wherein the processor is configured to determine the reference time defined by the sampled and digitized first signal component and the reference time defined by the sampled and digitized second signal component using interpolation.

6. The device of claim 1, further comprising:

a delay element, arranged to receive the trigger signal and to provide a delayed version of the trigger signal to the input, as the first signal component.

7. The device of claim 1, wherein the input comprises a signal combiner, arranged to receive the first and second signal components and to combine the first and second signal components into a single signal.

8. The device of claim 1, wherein the first signal component is sampled and digitized on a first channel of the ADC and the second signal component is sampled and digitized on a second, separate channel of the ADC.

9. The device of claim 1, wherein the processor is configured to determine a plurality of time intervals, each time interval being between respective first and second signal components, the processor being further configured to determine an average time interval based on an average of the plurality of determined time intervals.

10. An ion detection system for a time-of-flight mass spectrometer comprising:

an ion detector; and the device of claim 1, wherein the second signal component is derived from the output of the ion detector.

11. A method for time interval measurement in a time-of-flight mass spectrometer, comprising:

receiving first and second signal components, the first signal component being derived from a trigger signal that causes or indicates generation of the second signal component;

sampling and digitizing the received first and second signal components; and determining a time interval between the first and second signal components based on a reference time defined by the sampled and digitized first signal component and based on a reference time defined by the sampled and digitized second signal component.

* * * * *